(12) United States Patent
Singh et al.

(10) Patent No.: US 6,469,512 B2
(45) Date of Patent: Oct. 22, 2002

(54) SYSTEM AND METHOD FOR DETERMINING BATTERY STATE-OF-HEALTH

(75) Inventors: Harmohan Singh, Rockaway; Thirumalai G. Palanisamy, Morristown; Richard B. Huykman, Montville; William C. Hovey, Rockaway, all of NJ (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/745,901

(22) Filed: Dec. 22, 2000

(65) Prior Publication Data

US 2001/0033169 A1 Oct. 25, 2001

Related U.S. Application Data

(60) Provisional application No. 60/175,639, filed on Jan. 12, 2000.

(51) Int. Cl.[7] ............................................. G01N 27/416
(52) U.S. Cl. ...................................... 324/426; 324/429
(58) Field of Search ............................... 324/426, 429, 324/430, 434, 427; 320/132, 106

(56) References Cited

U.S. PATENT DOCUMENTS

| | | |
|---|---|---|
| 3,997,834 A | 12/1976 | Winter et al. ............... 324/427 |
| 4,937,528 A | 6/1990 | Palanisamy ................. 324/430 |
| 5,049,803 A | 9/1991 | Palanisamy ................. 320/132 |
| 5,057,383 A | 10/1991 | Sokira ........................ 429/92 |
| 5,160,880 A | * 11/1992 | Palanisamy ................. 320/106 |
| 5,479,085 A | 12/1995 | Honda et al. ................. 320/48 |
| 5,656,919 A | 8/1997 | Proctor et al. ............... 320/30 |
| 5,658,682 A | 8/1997 | Usuda et al. ................. 429/92 |
| 5,691,078 A | 11/1997 | Kozaki et al. ................ 429/92 |
| 5,710,501 A | 1/1998 | Phuoc et al. .................. 320/2 |
| 5,747,189 A | 5/1998 | Perkins ........................ 429/91 |
| 5,929,609 A | * 7/1999 | Joy et al. ....................... 322/25 |
| 5,955,865 A | 9/1999 | Kalke et al. ................. 320/104 |
| 5,963,016 A | 10/1999 | Arai et al. ................... 320/132 |
| 6,064,182 A | * 5/2000 | Eguchi ....................... 320/132 |

* cited by examiner

Primary Examiner—Edward H. Tso
Assistant Examiner—Lawrence Luk
(74) Attorney, Agent, or Firm—Loria B. Yeadon; Michele M. Burris

(57) ABSTRACT

A system and method for accurate and in real time determination of factors relating to the state of health of a storage battery. The system measures the values of battery temperature, voltage and current flow into and out of the battery. This data is multiplexed into a computer and the battery's internal resistance (IR), polarization resistance (PR), state of charge (SOC) and its cold cranking amp (CCA) capability are computed and displayed. The presence of shorted and mismatched cells also can be determined and displayed. The state of health of the battery is related to these displayed measured values and calculated factors which are made known to the user of the battery.

7 Claims, 2 Drawing Sheets

SYSTEM AND METHOD FOR DETERMINING BATTERY STATE-OF-HEALTH

RELATED APPLICATION

The present application claims the priority of U.S. Provisional Application No. 60/175,639, entitled System and Method for Determining Battery-State-of-Charge and Battery-State-of-Health, filed on Jan. 12, 2000, the entirety of which is hereby incorporated by reference.

FIELD OF THE INVENTION

The invention relates to a method and system integrated with a battery for monitoring and displaying to a user of the battery on a real time basis the state of health of the battery by determining the state or condition of various battery factors.

BACKGROUND OF THE INVENTION

Knowledge of the state-of-health (SOH) of a battery installed on board a vehicle such as an automobile, aircraft, boat, or in a mission critical application, such as an uninterruptible power supply (UPS), is often required to ensure reliable operation of the vehicle or electrical system operated by the battery. Factors of the battery state of health include, among others, its load handling capability, state-of-charge (SOC) and low temperature starting limit. The current approach in the industry to determine factors indicative of battery state-of-health (SOH) is to perform the necessary tests in a laboratory or garage to determine battery SOC and other factors before installing the battery in the vehicle or other system. This approach is very time consuming and, to save time, sometimes only the battery voltage is measured before installation. This measurement alone is not indicative of the true status of the battery state of charge (SOC) and load handling capability under various operating conditions needed to be determined to ensure reliable operation of the battery in the vehicle or system in which it is to be installed. In addition, these techniques do not determine factors related to the battery SOH as it is operating under load in the vehicle or system.

A need exists to monitor these battery factors in a simple and reliable manner on a real time basis under all operating conditions with the battery installed in the vehicle or system to provide a more reliable and meaningful representation of the battery SOH. It is also desirable to display the state of these factors in a manner to be readily available to the operator of the vehicle or system in which the battery is installed.

SUMMARY OF THE INVENTION

The invention provides a system and method to provide accurate determination of various factors related to the SOH of a battery. The system includes the circuitry of the invention preferably mounted on or installed integral with the battery, although it can be located at a remote point in the vehicle or at another location. In accordance with the invention, measurements of battery temperature, battery voltage and current into and out of the battery are made on the battery while it is operating under load. From this data the system calculates the battery's internal resistance (IR) and its polarization resistance (PR). Utilizing the measured voltage, current and temperature parameters, and the calculated IR and PR, the circuit calculates other factors such as battery capacity, SOC and Cold Cranking Amperes (CCAs). These factors of the battery's health and status can be displayed directly at the battery or at a remote location. Availability of this data makes the battery "smart" and indicates its usefulness to the user under actual performance conditions. That is, the user is able to readily determine on a real time basis under operating conditions if the battery can satisfy the application for which it is being used or if it needs to be replaced.

OBJECTS OF THE INVENTION

It is an object of the invention to provide a system and method to measure, compute and display various functional factors of a battery related to its SOH under all operating states of the battery.

Another object is to provide a system and method integral with a battery to determine, compute and display in real time various factors relative to its state of health (SOH) while the battery is operating in the system in which it is installed.

A further object is to provide a system and method that monitors and displays various factors of a battery's condition relative to its state-of-health on a real time basis as the battery is used under load.

BRIEF DESCRIPTION OF DRAWINGS

A more complete understanding of the present invention will become apparent from the following description taken in conjunction with the accompanying drawings in which.

DETAILED DESCRIPTION OF THE INVENTION

The present invention is useful particularly with batteries of the rechargeable type. The invention is illustratively described as used with a lead acid battery, but may be applied to other rechargeable battery technologies, e.g., nickel-cadmium, lithium-ion, etc.

Figure 1:
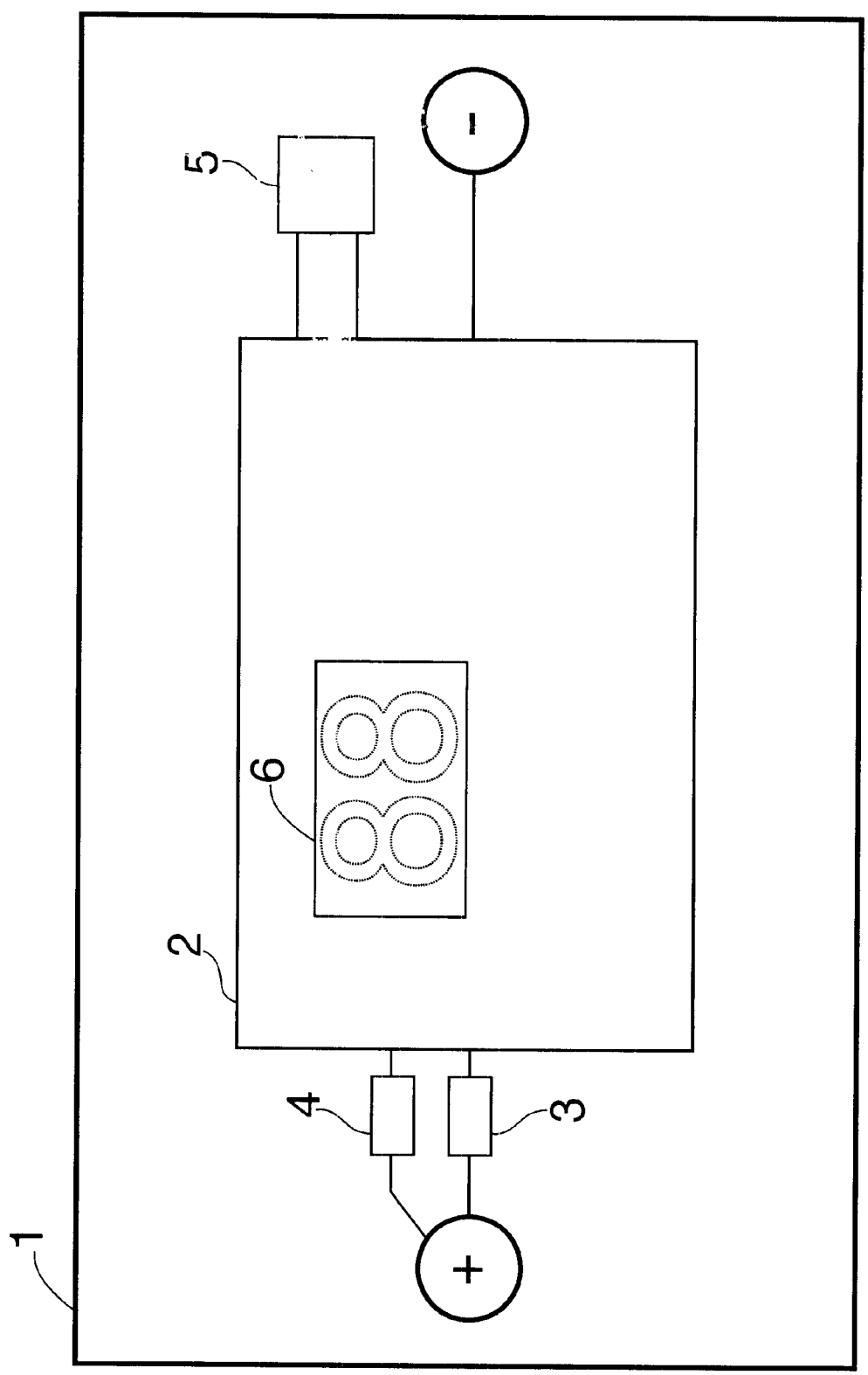
FIG. 1 is a general schematic diagram of the battery monitoring system in accordance with the invention.

As shown in FIG. 1, there is the battery 1, an electronic circuit module 2, a current sensor 3, a voltage sensor 4, a temperature sensor 5 and display 6. Battery 1 is schematically shown as being of the lead acid type that has a housing with positive and negative terminals. The battery is to be installed, such as in a vehicle, and cables are to be attached to its positive and negative terminals to connect it in the vehicle's electrical system to power various applications such as, for example, a starter motor, lighting, air conditioning, instruments, etc. The battery also can be installed in a mission critical system such as an UPS.

Figure 2:
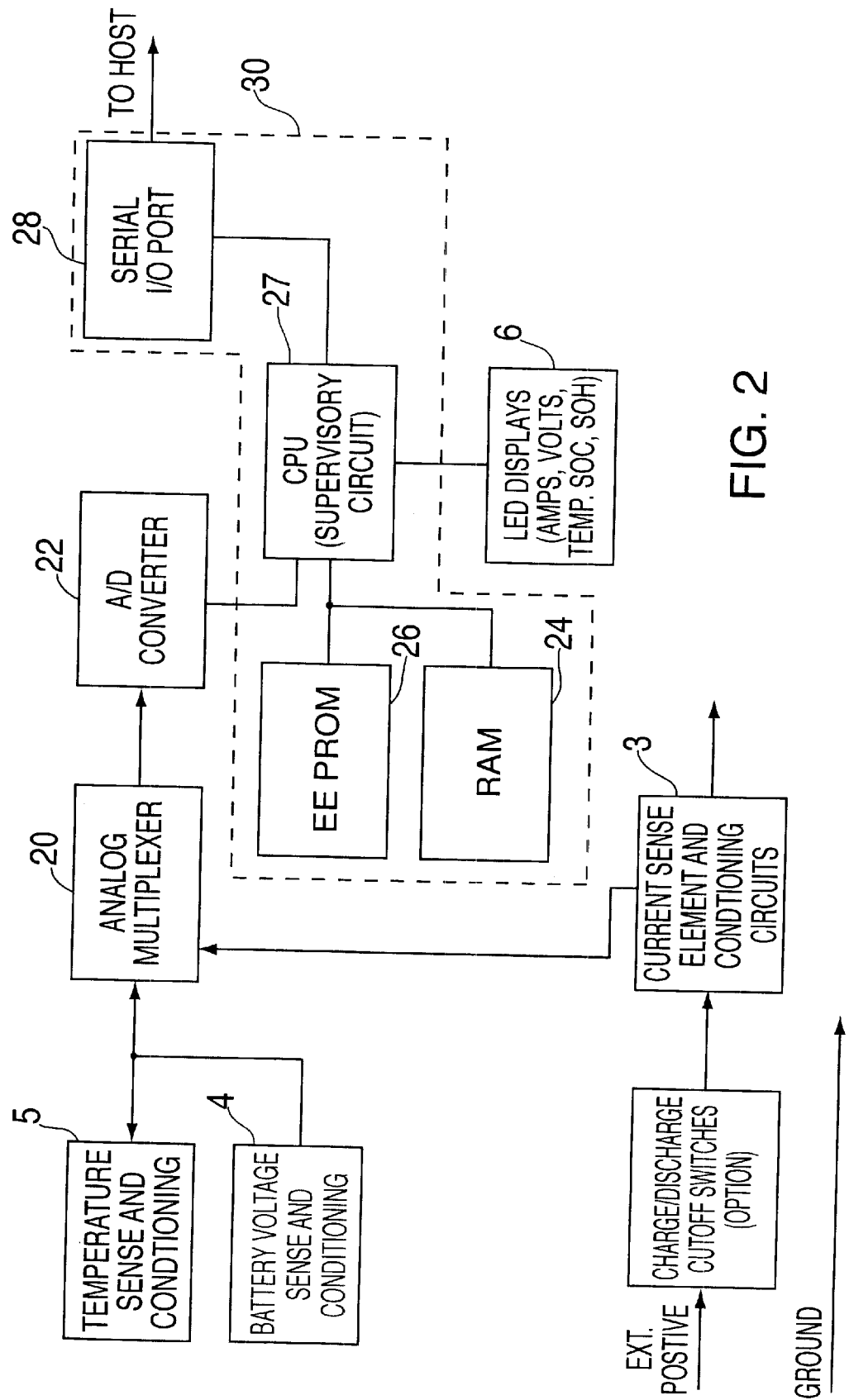
FIG. 2 is a schematic diagram of one illustrative embodiment of a system in accordance with the invention.

The electronic circuit 2 may be an analog circuit, but preferably includes, as described below, digital electronic microprocessor 30 with the necessary input and output components. Electronic circuit 2 thus includes, referring to FIG. 2, the microprocessor 30 and a computer input interface in the form of a multiplexer 20 and an analog to digital (A/D) converter 22. The voltage, current and temperature measured by sensor components 3, 4 and 5 are applied through the multiplexer 20 in multiplexed sequence to the A/D converter 22. The measurement data in digital form is applied to the microprocessor 30.

The microprocessor 30 is of a conventional type and includes the usual sections of an arithmetic logic unit to perform various calculations, a random access memory (RAM) 24 to store variable data input from the multiplexer 20, a read only memory (ROM) 26 in which an application program is stored, a CPU (supervisory circuit) 27, and an input/output 28 for communication, if desired with an external host processor. The ROM can be of the EPROM (erasable PROM) or similar type so that the application program can be changed. All of this is well known. The microprocessor 30 is programmed to use the digital values of the measured temperature, voltage and current parameters to calculate the values of battery parameters such as IR and polarization resistance (PR) and to determine from these various battery factors such as capacity, SOC and CCA. The electronic circuit 2 can be mounted on the battery, as shown, or be used at a remote location.

The specifications of the battery 1, such as its rated capacity in Amp/Hours and nominal voltage are known when the battery is manufactured and this information is stored in the ROM section of the microprocessor 30. These values are used in making various calculations.

The current sensor component 3 measures the current through the battery under load, that is, during charge and discharge. The current sensor can be implemented in various ways as discussed below. Each of the techniques produces an analog output that is applied through multiplexer 20 for conversion to digital form by the A/D converter 22. The particular implementation of the current sensor depends on the application and considers factors such as cost. One technique is to use a Hall current sensor around the battery terminal to detect current flow into and out of the battery. This is easy to implement but generally has higher costs than using a resistive element that measures the current as a voltage drop.

A preferred implementation is a current shunt, that is, a resistive element of known value, in series with one of the battery terminals (plus or minus). The voltage measured across the resistive element is an accurate indication of the current flow into and out of the battery. The shunt resistor implementation is preferred in the case with battery chemistries such as lithium ion and nickel metal hydride where series cutoff switches are required to prevent over charge and over discharge to protect the battery cells which must operate within specific ranges. Since the switches must be added in series in any configuration of use, adding a calibrated resistor of low value (ohms) is compatible with the other manufacturing steps. Lead acid batteries tolerate high currents and large voltage swings such that the cutoff switches are not commonly implemented internally or externally. The function of the cutoff switches is typically built into the battery charger rather than the battery for a lead acid battery. Here, a shunt resistor can be connected in series with one of the cables. Each of the various current sensing implementations has the necessary scaling and filtering circuits (not shown) and produces an output that is converted to a voltage corresponding to the current. This is converted into digital data by the A/D connector 22 for use by the microprocessor 30.

The voltage sensing component 4 is a voltmeter which measures the voltage across the battery 1 terminals under no load (open circuit voltage—OCV) and load conditions. This is done by scaling the voltage with amplifiers and buffering (not shown) and multiplexing it through multiplexer 20 into the A/D converter 22. A digital volt meter also can be used to eliminate the A/D conversion step. The voltmeter also can be used to measure the voltage across the shunt for determining the current. The battery terminal voltage measurements are used, as described below, to determine the battery SOC. Changes in the terminal voltage of the battery are used by the microprocessor 30 with changes in the current measurements to calculate battery internal resistance (IR), also described below.

The temperature sensor 5 is implemented by any of the well known semiconductor elements or RTDs (resistive temperature devices) called thermocouples. This type of element can be embedded in the battery. Such a sensor is already part of the gas gauge chips for lithium batteries. Basically, the sensor measures a change in temperature and generates a change in voltage through or across the sensor. The voltage output is multiplexed through multiplexer 20 into the A/D converter 22 and processed by the microprocessor 30 for direct display of the temperature and/or in calculating a battery factor.

The display component 6 can be a conventional LCD, LED or other conventional display that is driven by the microprocessor 30 using any necessary amplifiers. The display 6 displays the output of the measurements, such as the voltage, current and temperature. It also displays calculated values such as IR, PR, SOC, CCA (cold cranking hours) and capacity, these being factors related to the battery SOH. Display of the various measured and calculated values can be done automatically such as on a timed basis. The display also can be on an event driven basis such as a battery condition, e.g. voltage, IR, change. An on-call display of the values also is preferably used.

As shown in FIG. 1, the display can be integrated directly on the battery, such as placed on its case. It also can be at a location remote from the battery. The display 6 also can be located with the electronic circuit 2 or remote from it.

The circuit operates to supply the continuously measured battery temperature, current and voltage parameters on a multiplexed basis to the microprocessor 30 under all battery operating conditions, such as open circuit (no load), charging or discharging. These measured parameters can be displayed by display 6. Various calculations are made by the microprocessor 30 using these measured parameters to determine factors related to the battery SOH. These factors also can be displayed. The various battery factors calculated by the microprocessor 30 are described below.

Internal Resistance (IR). One value needed to determine several factors related to the battery's SOH is its internal resistance (IR). The battery IR is one of the determinants relating to its SOH. It is known that the maximum instantaneous power that a battery can output is inversely proportional to its internal resistance. Also, a battery with a high IR indicates a sulfated condition, meaning that the battery may be in a deteriorating state. There is a possibility of recovery of such a battery if the sulfated condition is detected at a proper, usually early, stage. A battery with a low IR indicates a good SOC condition, a factor indicative of good battery SOH.

Battery IR may be determined by passing a signal from the electronic circuit 2 into the battery and by analyzing the battery output. The signal may be a series of voltage pulses to determine battery IR as a DC resistance value. The DC value of the IR is used in the calculation of other battery factors. The microprocessor 30 controls the production and application of the sampling pulses as well as making the calculations of IR.

For example, to determine battery IR on a DC basis, a low frequency oscillator such as 1.0 kHz provides a pulse of known voltage value and there is controlled sampling of the battery current output in response to these pulses. The precision measured current level is used with the change in battery terminal voltage to compute the internal resistance of the battery. This calculation is made by the microprocessor 30.

When using the internal oscillator, the battery IR can be measured when the battery is under low load or no load such as when it is stored on a shelf. Methods to determine battery internal resistance using DC pulse are described in U.S. Pat. Nos. 4,937,528 and 5,049,803, which are assigned to assignee herein and the disclosures of which are incorporated herein by reference.

Battery IR may also be determined by other methods such as by using the change in battery voltage for a given change in current. For example, a large current charge pulse of a known value can be applied or discharge pulse produced and the battery IR computed from the current pulse amount and change in battery terminal voltage measurement in response to the current pulse. That is, $$IR = \frac{dV(change\ in\ voltage)}{dI(change\ pulse\ amount)} \quad (1)$$

Polarization Resistance (PR). Battery polarization resistance, which arises from non-uniformity in electrolyte concentration in the electrolyte concentration in the battery electrodes (plates) to the bulk of the electrolyte between the plates, also affects the battery power output. Battery PR is:

$$PR = IR(DC) - IR(AC) \quad (2)$$

where IR(AC) is the internal resistance of the battery determined on an AC basis. For example, the circuit 2 produces a sine wave type voltage of a suitable frequency that is applied to the battery and the current response is measured. The IR(AC) is calculated from this by the microprocessor. The battery DC internal resistance and the AC internal resistance are compared and the difference is the polarization resistance (PR). This calculation is made by the microprocessor.

The PR is indicative of one battery SOH factor, this being the electrolyte level. If PR exceeds a predetermined magnitude, the microprocessor can be programmed to operate the display to show a battery electrolyte level deficiency.

Capacity. The capacity of a battery is rated in amp/hours. This is the amount of current that the battery can deliver over the stated time. The battery capacity is a function of its manufacture determined by, for example, the number, size and connection of the electrodes. This is known for each battery. The capacity value is programmed into the microprocessor 30. It also can be displayed if desired.

State of Charge (SOC). The SOC of a battery is generally defined as the percentage of actual battery capacity available relative to the rated battery capacity. That is, a battery can be charged from 0% of its rated capacity (discharged) to 100% (fully charged). The computer determines SOC as the basis of the formula.

$$SOC = 100 - \frac{(12.7 - OCV)}{1.2} \times 100\% \quad (3)$$

where OCV is the battery output voltage at no load or open circuit. The basis for the above equation (3) is given in patent U.S. Pat. No. 4,937,528 and also in U.S. Pat. No. 5,049,803, both of which are assigned to the assignee of the subject application.

In another method of calculating SOC, the microprocessor 30 counts a time during which the battery remains in an open circuit state for more than a specified time (e.g., 8 hours). The battery state of charge (SOC) is calculated at this time using the measured open circuit voltage (OCV) and the formula of equation (3). The SOC displayed if desired.

Shorted Cell. If the battery voltage falls below a specified voltage level within a certain time after charging to full capacity and there was no discharge current as detected by the current sensor, the circuitry 2 indicates the presence of a shorted cell. The microprocessor 30 is programmed to detect this by first determining that the battery has reached a fully charged state (SOC=100%), and measuring the battery voltage. A clock loop of a required time, for example, 60 seconds, is started during which the battery's discharge current is measured. The battery voltage is measured at the end of the time loop. If the battery voltage has dropped to a predetermined level at the end of the loop and there has been no discharge of current detected during the time of the loop, indication of a shorted cell is displayed.

Mismatched Cells. When a battery is in use, if the battery voltage during discharge goes through two plateaus, or during charge the slope of the voltage curve goes through a maximum, this indicates the presence of mismatched cells. In the circuit of the invention, the battery is discharged by the load of the system in which it is installed. The battery is usually charged by an alternator.

The microprocessor 30 continually receives the measured battery voltage data. It is programmed to monitor the battery voltage during discharge, when the voltage normally drops (decreases) to one plateau upon application of a load, to determine if there has been two drops. If so, the display 6 is operated to produce a warning of a mismatched cell. That is, the microprocessor performs this calculation during the time it is receiving data from the circuit current sensor that a load is being applied to the battery.

Similarly, the microprocessor also measures the battery voltage during its charge and calculates the slope $$\frac{dV}{dt}$$

Successive measurements of the slope are compared and if it is determined that the slope has gone through a maximum, then a warning of a mismatched cell is displayed. The microprocessor is instructed that the battery is being charged by being provided information by the current sensor.

Temperature. The system operating under control of the microprocessor measures the battery temperature continuously or periodically, as desired. During charging, if the battery temperature exceeds a predetermined limit then the charge is cut off automatically or an audio alert such as a siren is activated to alert the operator. This helps eliminate the risk of thermal run-away.

Cold Cranking Amps (CCA). Battery cold cranking amps is defined for a lead acid battery for an automobile application as a measurement of the number of amps a battery can deliver at full load for 30 seconds and not drop from its rated voltage of 12.6 volts to below 7.2 volts. A high CCA battery rating is desired for cold weather use of a battery. If an indication of the battery's output capability as a function of ambient temperature is needed (CCA) for some critical applications, such as automotive starting, the circuit of the invention can determine this capability.

It has been found that the battery internal resistance (IR) as measured by the DC charge or discharge pulse, as described above, is inversely related to the battery CCA. That is, the higher the battery IR, the lower the CCA. The DC pulse current used to measure IR may be the starting current in the vehicle or provided from a location wherever the battery is used. It can be a charge pulse current from a charger, alternator/regulator or power supply.

New batteries having different CCA ratings were used and the internal resistance of the batteries was determined. It was found that the relationship between their CCA and internal resistance can be described by the equation $$CCA = 950.2 - 18616.6 * IR \quad (4)$$

All automotive (lead acid) batteries follow this equation. Industrial batteries are not generally characterized by a CCA rating.

In the smart battery of the present invention, the circuit measures the change in voltage corresponding to a change in load current and IR is calculated by the microprocessor using this data. The CCA is then calculated using equation (4). Since the electronic circuit 2 is always connected to the battery, it will follow the trends in battery IR as a function of its life and changes in its capacity are shown by the display 6 to provide the user with prognostic and diagnostic advice.

CCA also may be an important parameter for industrial batteries. In this case, a similar equation with different coefficients can be derived for the relationship between CCA and internal resistance of such industrial batteries.

Communications/Annunciators. The battery parameters, such as its rated capacity, and the application program or changes thereto, can be programmed into the microprocessor 30 ROM such as by means of a serial communications link. Various other communications busses exist, such as the SMBus, RS232, or 12C bus protocols.

The system can be implemented in one chip or a combination of several commercial chip components. Also, the system may be implemented with less than all of the components described if less information regarding the battery health is acceptable. For example, the temperature sensor may be eliminated if any capability of the smart battery circuit involving this sensor is not needed or desired for a particular application. Similarly, if only a state of charge is needed from the system the current sensor may also be eliminated. In this case, the SOC indication may be provided from the open circuit voltage.

Alternate embodiments may be devised without departing from the spirit or the scope of the invention.

The foregoing embodiments demonstrate methods and devices implemented and contemplated by the inventors in making and carrying out the invention. While the invention has been particularly shown and described with reference to the preferred embodiments thereof, the embodiments are not intended to be exhaustive or to limit the invention to the precise forms disclosed herein. It will be understood by those skilled in the art that various changes in form and detail may be made therein without departing from the spirit and scope of the invention. Numerous equivalent methods, devices, and techniques may be employed to achieve the same result. Similarly, any process steps described may be interchangeable with other steps in order to achieve the same result. It is intended that the scope of the invention is defined by the following claims and their equivalents.

We claim:

1. A method for monitoring and displaying to user of a vehicle or a system on a real time basis the state of health (SOH) of a storage battery on which said vehicle or system relies, said method comprising the steps of:
   measuring battery voltage and current under one of load and no load conditions for the battery;
   computing from the data of the measured battery voltage and current the battery internal resistance and polarization resistance;
   determining from said measured battery voltage and current and said computed battery internal resistance and polarization resistance the factors of battery state of change, cold cranking amperes, the presence of a shorted cell and the presence of a mismatched cell; and
   displaying to the user of said battery all of said determined factors.

2. The method of claim 1 wherein the battery is a lead acid storage battery and the step of determining the cold cranking amperes (CCA) factor comprises computing the battery internal resistance and applying the formula $$CCA = 950.2 - 18616.6 * IR.$$

3. A method for monitoring and displaying to a user of a vehicle or a system on a real time basis the state of health (SOH) of a storage battery on which said vehicle or system relies, said method comprising the steps of:
   measuring battery voltage and current under one of load and no load conditions for the battery;
   computing from the data of measured battery voltage and current the battery internal resistance and polarization resistance;
   determining from said measured battery voltage and current and said computed battery internal resistance and polarization resistance a plurality of the factors of battery state of charge, cold cranking amperes, the presence of a shorted cell and the presence of a mismatched cell;
   displaying to the user of said battery said plurality of determined factors; and
   wherein the step of computing the battery internal resistance is on a DC basis and comprises:
     applying one of a voltage (V) and a current (I) of known amount to the battery;
     determining the charge in battery current (dI) in response to the voltage of known amount and the change in battery voltage (dV) in response to the current of known amount; and
     computing the battery internal resistance (IR) using the formula dV/dI.

4. A method for monitoring and displaying to a user of a vehicle or a system on a real time basis the state of health (SOH) of a storage battery on which said vehicle or system relies, said method comprising the steps of:
   measuring battery voltage and current under one of load and no load conditions for the battery;
   computing from the data of the measured battery voltage and current the battery internal resistance and polarization resistance;
   determining from said measured battery voltage and current and said computed battery internal resistance and polarization resistance a plurality of factors of battery state of charge, cold cranking amperes, the presence of a shorted cell and the presence of mismatched cell;
   displaying to the user of said battery said plurality of determined factors; and
   wherein the step of computing the battery internal resistance is on an AC basis and comprises;
     applying an alternating current voltage or current to the battery;
     measuring the corresponding battery current and voltage response; and
     calculating the resistance from the applied voltage or current and the measured response.

5. A method for monitoring and displaying to a user of a vehicle or a system on real time basis the state of health (SOH) of a storage battery on which said vehicle or system relies, said method comprising the steps of:

measuring battery voltage and current under one of load and no load conditions for the battery;

computing from the data of the measured battery voltage and current the battery internal resistance polarization resistance, wherein said computing of the battery internal resistance comprises computing the battery internal resistance on a DC basis and computing the battery internal resistance on an AC basis;

determining from said measured battery voltage and current and said computed battery internal resistance and polarization resistance the battery state of charge, cold cranking amperes, the presence of a shorted cell and the presence of a mismatched cell;

displaying to the user of said battery said determined factors; and wherein the step of computing the polarization resistance comprises subtracting the internal resistance computed on an alternating current basis from the internal resistance computed on a direct current basis.

6. The method of claim 5 wherein said step of computing the battery internal resistance on a DC basis comprises applying one of a voltage (V) and a current (I) of known amount to the battery and determining the change in current (dI) in response to the voltage of known amount and the change in battery voltage (dV) in response to the current of known amount.

7. A system for monitoring and displaying to a user of a vehicle on a real time basis the state of health (SOH) of a lead acid storage battery on which said vehicles relies, said system comprising a circuit module mounted to the battery with a connection to at least one of the battery terminals and said circuit module including:

means for measuring the battery voltage and current under one of load and no load conditions and for producing voltage and current data values in digital form;

means for computing from the data values of the measured battery voltage and current the internal resistance and polarization resistance and for computing from the battery voltage, current, internal resistance (IR) and polarization resistance at least one of the factors of battery state of charge, cold cranking amperes (CCA), the presence of a shorted call and the presence of a mismatched cell, said cold cranking amperes factor being computed on the basis of $$CCA = 950.2 - 1816.6 * IR$$

and a display for displaying said computed factors to the user of the battery.

* * * * *